US010586790B2

(12) United States Patent
Prabhat et al.

(10) Patent No.: US 10,586,790 B2
(45) Date of Patent: Mar. 10, 2020

(54) PERIPHERY BODY BIASING FOR MEMORY APPLICATIONS

(71) Applicant: Arm Limited, Cambridge (GB)

(72) Inventors: Pranay Prabhat, Cambridge (GB); James Edward Myers, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/942,132

(22) Filed: Mar. 30, 2018

(65) Prior Publication Data

US 2019/0304962 A1  Oct. 3, 2019

(51) Int. Cl.
*H01L 27/02* (2006.01)
*G11C 11/417* (2006.01)
*G11C 11/412* (2006.01)
*H01L 27/11* (2006.01)

(52) U.S. Cl.
CPC ........ *H01L 27/0207* (2013.01); *G11C 11/412* (2013.01); *G11C 11/417* (2013.01); *H01L 27/1116* (2013.01)

(58) Field of Classification Search
None
See application file for complete search history.

(56) References Cited

U.S. PATENT DOCUMENTS 6,341,087 B1 * 1/2002 Kunikiyo ............... G11C 5/146
 365/189.09
2007/0205801 A1 * 9/2007 Perisetty .......... H03K 19/00315
 326/26

OTHER PUBLICATIONS

Dong, et al.; A 0.3V VDDmin 4+2T SRAM for Searching and In-Memory Computing Using 55nm DDC Technology; 2017 Symposium on VLSI Circuits Digest of Technical Papers; IEEE; 2017. DOI: 10.23919/VLSIC.2017.8008465.
Myers, et al.; A Subthreshold ARM Cortex-M0+ Subsystem in 65 nm CMOS for WSN Applications with 14 Power Domains, 10T SRAM, and Integrated Voltage Regulator; IEEE Jounral of Solid-State Circuits; vol. 51, No. 1; pp. 31-44; IEEE; Jan. 2016. DOI: 10.1109/JSSC.2015.2477046.
Zhao, et al; Novel Self-Body-Biasing and Statistical Design for Near-Threshold Circuits With Ultra Energy-Efficient AES as Case Study; IEEE Transactions on Very Large Scale Integration (VLSI) Systems; vol. 23, No. 8; pp. 1390-1401; IEEE; Aug. 2015. DOI: 10.1109/TVLSI.2014.2342932.
Ananthan, et al.; Larger-than-Vdd Forward Body Bias in Sub-0.5V Nanoscale CMOS; Proceedings of the 2004 International Symposium on Low Power Electronics and Dseign (ISLPED'04); IEEE; 2004. DOI: 10.1109/LPE.2004.240695.

* cited by examiner

*Primary Examiner* — James G Norman
(74) *Attorney, Agent, or Firm* — Pramudji Law Group PLLC; Ari Pramudji

(57) ABSTRACT

Various implementations described herein are directed to an integrated circuit having a core array region with an array of memory devices. The integrated circuit may include a periphery region having periphery logic devices that interface with the array of memory devices. The integrated circuit may include a boundary region having one or more buffer devices coupled to body terminals of the periphery logic devices to drive the body terminals of the periphery logic devices using a body biasing signal provided by the one or more buffer devices.

20 Claims, 5 Drawing Sheets

PERIPHERY BODY BIASING FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

At low voltage, transistor performance may degrade exponentially as the supply voltage approaches the transistor threshold voltage. This may cause chip frequency to slow down drastically, which reduces the computational complexity of problems that the chip can tackle at low voltage. Further, in this instance, the chip is on and active for longer time periods, thus reducing sleep time and hurting overall energy efficiency.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to memory circuitry having periphery body biasing. Some implementations described herein are directed to random access memory (RAM) (and, in some cases, read-only memory (ROM)) using various digital periphery body biasing schemes and techniques, including, e.g., boosting static RAM (SRAM) performance by implementing digital periphery body biasing. As such, various implementations described herein seek to improve SRAM performance at low voltage by using digital full-rail forward body biasing (FBB) to speed up the SRAM periphery. For instance, schemes and techniques described herein provide circuitry to digitally adjust body bias of periphery circuits in an SRAM macro at low voltage, without having to implement analog circuitry, so as to thereby improve SRAM performance at low voltage. Therefore, schemes and techniques described herein improve SRAM performance at low voltage with periphery body biasing.

Various implementations of system memory that conserves energy will now be described in detail herein with reference to FIGS. 1A-4. In some instances, the various implementations described herein may be applied to cache memory.

Figure 1A:
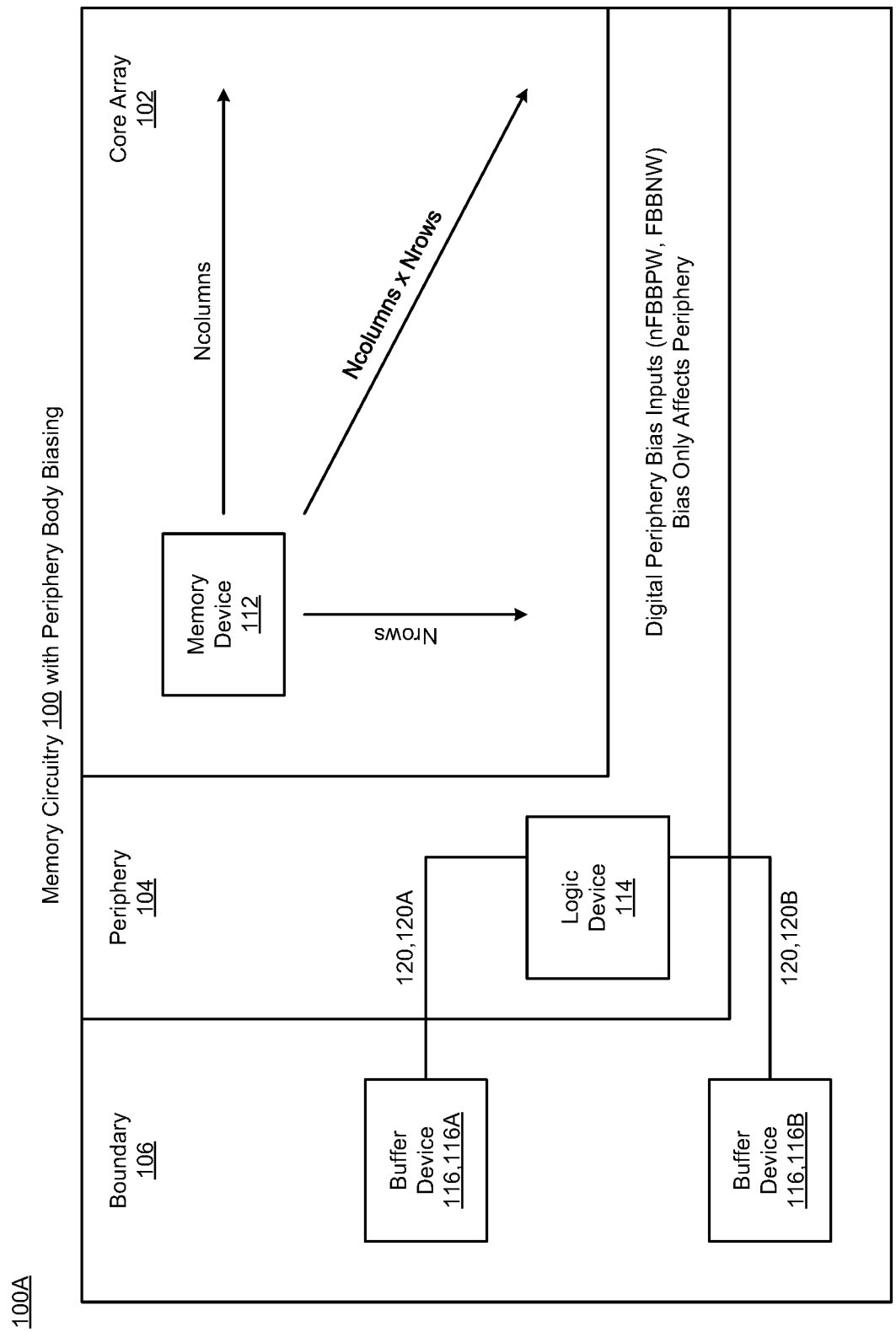
FIGS. 1A-1B illustrate a diagram of memory circuitry having periphery body biasing in accordance with various implementations described herein.
Figure 1B:
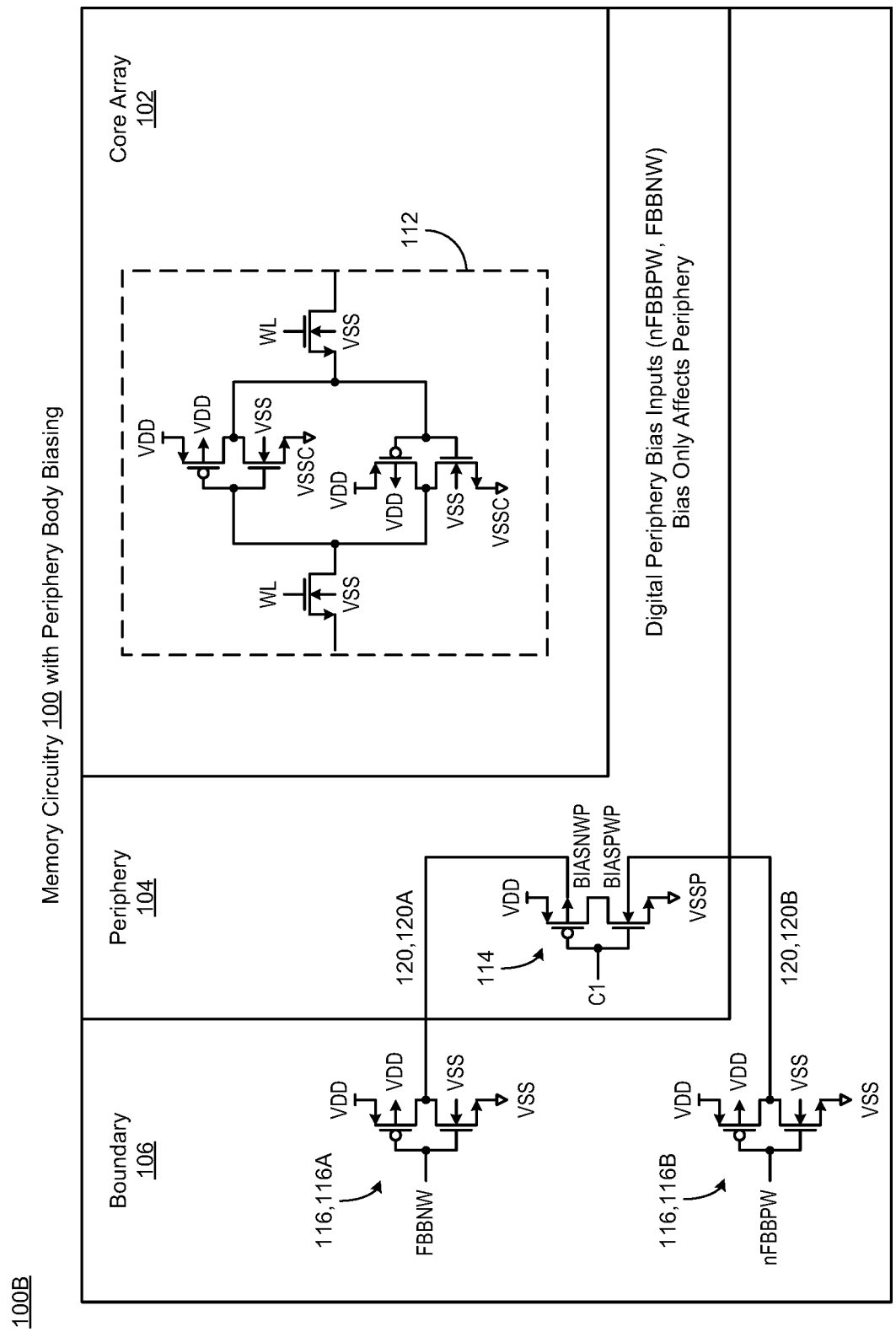

FIGS. 1A-1B illustrate diagrams 100A, 100B of memory circuitry 100 with periphery body biasing in accordance with various implementations described herein. In some instances, the memory circuitry 100 may include multiple designated regions, such as, e.g., a core array region 102, a periphery region 104, and a boundary region 106. These regions 102, 104, 106 may be coupled together to interface with each other and operate collectively to provide periphery body biasing for the memory circuitry 100, as described herein. The memory circuitry 100 may be referred to simply as a memory circuit.

As shown in FIG. 1A, the core array region 102 includes an array of memory devices 112, such as, e.g., memory cells and/or bitcells. The core array region 102 may include various types of memory cell circuitry, and the array of memory devices 112 may include an array of bitcell devices (or other memory cell devices). For instance, in some implementations, the memory circuitry 100 may be embodied as random access memory (RAM) circuitry, and the array of memory devices 112 (e.g., bitcells) may be embodied as RAM memory devices (e.g., RAM bitcells).

The core array region 102 may include any number of memory devices 112 that are arranged in various configurations, such as, e.g., two-dimensional (2D) memory array (Ncolumns×Nrows) having any number (N) of columns (Ncolumns) and any number of rows (Nrows) of multiple memory devices 112, which may be arranged in a 2D grid pattern with 2D indexing capabilities. In general, each memory device 112 may be referred to as a bitcell (or memory storage cell), and each bitcell may be configured to store at least one data bit value (e.g., data value associated with a logical '0' or '1'). The core array region 102 may be referred to simply as a core array.

The periphery region 104 may include one or more periphery logic devices 114 that interface with the array of memory devices 112. In FIG. 1A, the periphery region 104 is shown having one periphery logic device 114; however, in various implementations, the periphery region 104 may include multiple periphery logic devices 114. The periphery region 104 may be referred to simply as a periphery. As shown, FIGS. 1A-1B show one periphery logic device 114; however, in some implementations, the periphery logic device 114 may represent one or more or all of the logic devices in the periphery region 104, and therefore, this implementation may describe a scenario wherein uniform delivery of body biasing signals (BIASNWP, BIASPWP) may be provided from the boundary region 106 with multiple buffer devices 116. In various implementations, the one or more periphery logic devices 114 may be electrically connected through the substrate.

As shown in reference to FIG. 1B, the one or more periphery logic devices 114 may include various logic (or one or more logic devices, such as, e.g., inverters) with digital inputs, which may refer to logic inputs that are activated based on logic zero (0) or logic one (1). Also, the one or more periphery logic devices 114 may represent one or more or all logic in the periphery region 104. In some implementations, the digital inputs of the one or more periphery logic devices 114 refer to digital periphery body bias inputs (nFBBPW for a PMOS transistor and FBBNW for an NMOS transistor), wherein the bias only affects the periphery region 104. Further, each complementary pair of transistors may be coupled between a supply voltage (VDD) and a periphery ground VSSP. In some instances, FBB refers to full body biasing or forward body biasing. In various instances, full body biasing and/or digital forward body biasing may be used as a technique for driving wells using digital logic signals. In other instances, forward body biasing may generally refer to one or more or all analog and digital forms of forward body biasing. Also, in some instances, the one or more transistors may be activated based on one or more activation signals, such as, e.g., activation signal C1. In some instances, C1 may or may not be referred to as a control signal. For instance, inverter 114 may embody an abbreviated representation of one or more or all digital logic in the memory periphery, such as, e.g., one or more or all inverters, NAND, NOR, MUX, and/or any other custom gates that process required data and control signal(s).

The boundary region 106 may include one or more buffer devices 116 coupled to body terminals of the one or more periphery logic devices 114 to thereby drive the body terminals of the one or more periphery logic devices 112 using (or making use of) a body biasing signal 120 provided by the one or more buffer devices 116. Also, the one or more buffer devices 116 may be referred to as one or more well drivers. As shown, the one or more buffer devices 116 may provide the body biasing signal 120. In some instances, the body biasing signal 120 may be referred to as a forward body biasing signal that is provided by the one or more buffer devices 116. In some other instances, the body biasing signal 120 may be referred to as a digital body biasing signal provided by the one or more buffer devices 116. Thus, the body biasing signal 120 may also be referred to as a digital forward body biasing signal. In reference to FIG. 1A, the boundary region 106 is shown having two buffer devices 116; however, in various implementations, the boundary region 106 may include more than two buffer devices 116. Further, the boundary region 106 may be referred to simply as a boundary, or in some cases, a RAM boundary.

The one or more buffer devices 116 may include a first buffer device 116A that is disposed in the boundary region 106 and is also coupled to at least one periphery logic device 114 in the periphery region 104. As shown, the body biasing signal 120 may be referred to as a first body biasing signal 120A, and the first buffer device 116A may provide the first body biasing signal 120A to the at least one periphery logic device 114. Also, the one or more buffer devices 116 may include a second buffer device 116B that is disposed in the boundary region 106 and is also coupled to the at least one periphery logic device 114 in the periphery region 104. As shown, the body biasing signal 120 may be referred to as a second body biasing signal 120B, and the second buffer device 116B may provide the second body biasing signal 120B to the at least one periphery logic device 114.

As shown in FIG. 1B, the one or more buffer devices 116 may include one or more inverters with digital inputs, which refer to logic inputs that are activated based on logic zero (0) or logic one (1). The one or more buffer devices 116, 116A, 116B in the boundary region 106 may be configured to drive the body terminal of each periphery logic device 114 in the periphery region 104 without affecting the body terminals of the memory devices 112 in the core array region 102. In some instances, affecting the body terminals of the memory devices 112 in the core array region 102 may refer to affecting the body potential (i.e., the body voltage) that may be applied to the body terminals of the memory devices 112 in the core array region 102. Further, each complementary pair of transistors may be coupled between VDD and ground VSS.

In some instances, as shown in FIG. 1B, each memory device 112 of the core array 102 may be implemented with Static RAM (SRAM) circuitry. As such, each memory device 112 may include a multi-transistor SRAM cell, including various types of SRAM cells, such as, e.g., 6T CMOS SRAM (as shown, e.g., in FIG. 1B) and/or other types of CMOS SRAM cells having, e.g., 4T, 8T, 10T or more transistors per bit. Thus, the memory devices 112 may include SRAM cells, and the core array 102 may include an SRAM cell array. However, various other types of memory may be used. For instance, the various schemes and techniques described herein may be used for various non-volatile types of memory, such as, e.g., read-only memory (ROM) applications.

In some implementations, static RAM bitcells may include the 6T bitcell, which may have access ports controlled by wordlines. In other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Therefore, although these multi-ports transistor types may vary within each bitcell, there may also be a need to have a variation between arrays as in type one, like a left half array and a right half array.

In some implementations, the core array region 102, the periphery region 104, and/or the boundary region 106 operate at low voltage. The low voltage may be applied as an operating voltage to each memory device 112 in the core array region 102 and each periphery logic device 114 in the periphery region 104. In some instances, the low voltage is less than a diode forward voltage depending on fabrication process technology. For instance, the diode forward voltage for some specific fabrication process technologies may refer to a voltage of less than 0.7 V at ambient temperature.

In some implementations, as shown in FIG. 1B, each memory device 112 has multiple transistors that are body biased with VDD or VSS. For instance, each memory device 112 may include multiple complementary MOS devices, such as PMOS transistors and NMOS transistors, wherein the PMOS transistors are body biased with VDD and the NMOS transistors are body biased with VSS. In some instances, one or more transistors may be activated based on one or more activation signals, such as, e.g., wordline signals WL. Further, as shown in FIG. 1B, each complementary pair of transistors may be coupled between VDD and a core ground VSSC.

The memory circuitry 100 may be implemented as an integrated circuit (IC) for various types of memory applications, such as, e.g., RAM and/or any other type of volatile and/or non-volatile memory, including read-only memory (ROM). The memory circuitry 100 may be implemented as an IC with dual rail memory architecture and related circuitry. Also, the memory circuitry 100 may be integrated with computing circuitry and related components on a single chip. The memory circuitry 100 may also be implemented in embedded systems for electronic and mobile applications, including low power sensor nodes for IoT (Internet of things) applications.

Figure 2:
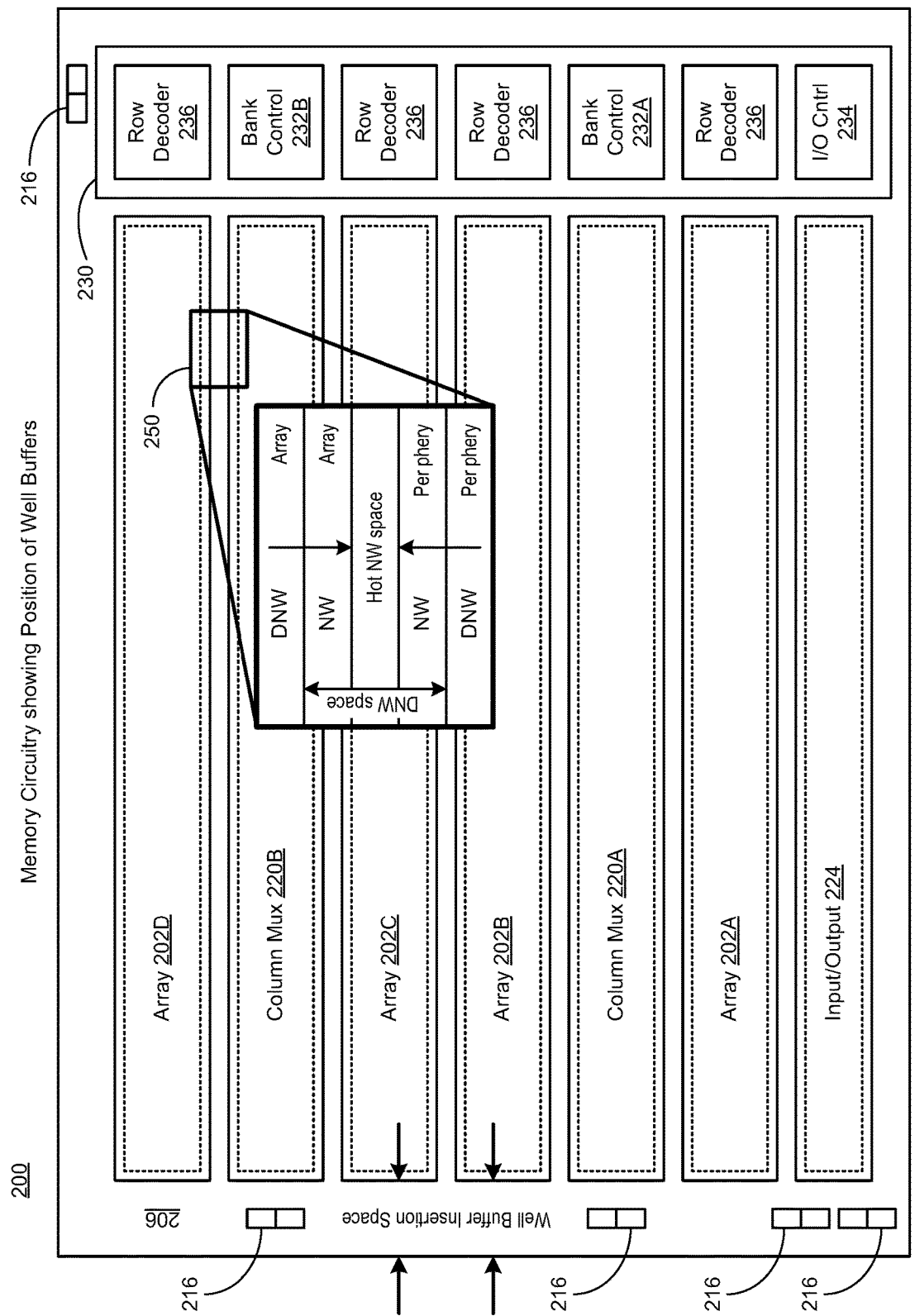
FIG. 2 illustrates a diagram of a memory circuitry showing position of well buffers in accordance with various implementations described herein.

FIG. 2 illustrates a diagram of memory circuitry 200 showing position of well buffers in accordance with various implementations described herein.

As shown in FIG. 2, the memory circuitry 200 may include multiple banks of arrays 202A, 202B, 202C, 202D and multiple column multiplexors 220A, 220B, wherein a first column multiplexor 220A may be coupled to first and second banks of arrays 202A, 202B, and a second column multiplexor 220B may be coupled to third and fourth banks of arrays 202C, 202D. The memory circuitry 200 may include input/output (I/O) circuitry 224 and control circuitry 230 that are coupled to the multiple banks of arrays 202A, 202B, 202C, 202D and the multiple column multiplexors 220A, 220B. The control circuitry 230 may include multiple control blocks including, e.g., first bank control circuitry 232A, second bank control circuitry 232B, I/O control circuitry 234, and row decoder circuitry 236. The memory circuitry 200 may be implemented with SRAM architecture.

As shown, the memory circuitry 200 may include pairs of well buffers 216 in a boundary region 206, which correspond to pairs of buffers 116 in the boundary region 106 of FIGS. 1A-1B. The buffers 116, 216 may be referred to as well buffers or well drivers, and the boundary region 206 may be referred to as a well buffer insertion space. Also, pairs of well buffers 216 may provide improved drive for body biasing. In some instances, this improvement is due to reduced proximity to the periphery N-well.

Further, a window showing an expanded view of a periphery space 250 is provided to identify a deep N-well (DNW) region in the array 202D, an N-well (NW) region in the array 202D, a DNW region in the column multiplexor 220B (which is part of the periphery), and a DNW region in the column multiplexor 220B (which is also part of the periphery). Further, the array 202D and the column multiplexor 220B may be separated by a hot NW space, and as shown, the NW of the array 202D, the NW of the column multiplexor 220B, and the hot NW space may define a DNW space.

Figure 3:
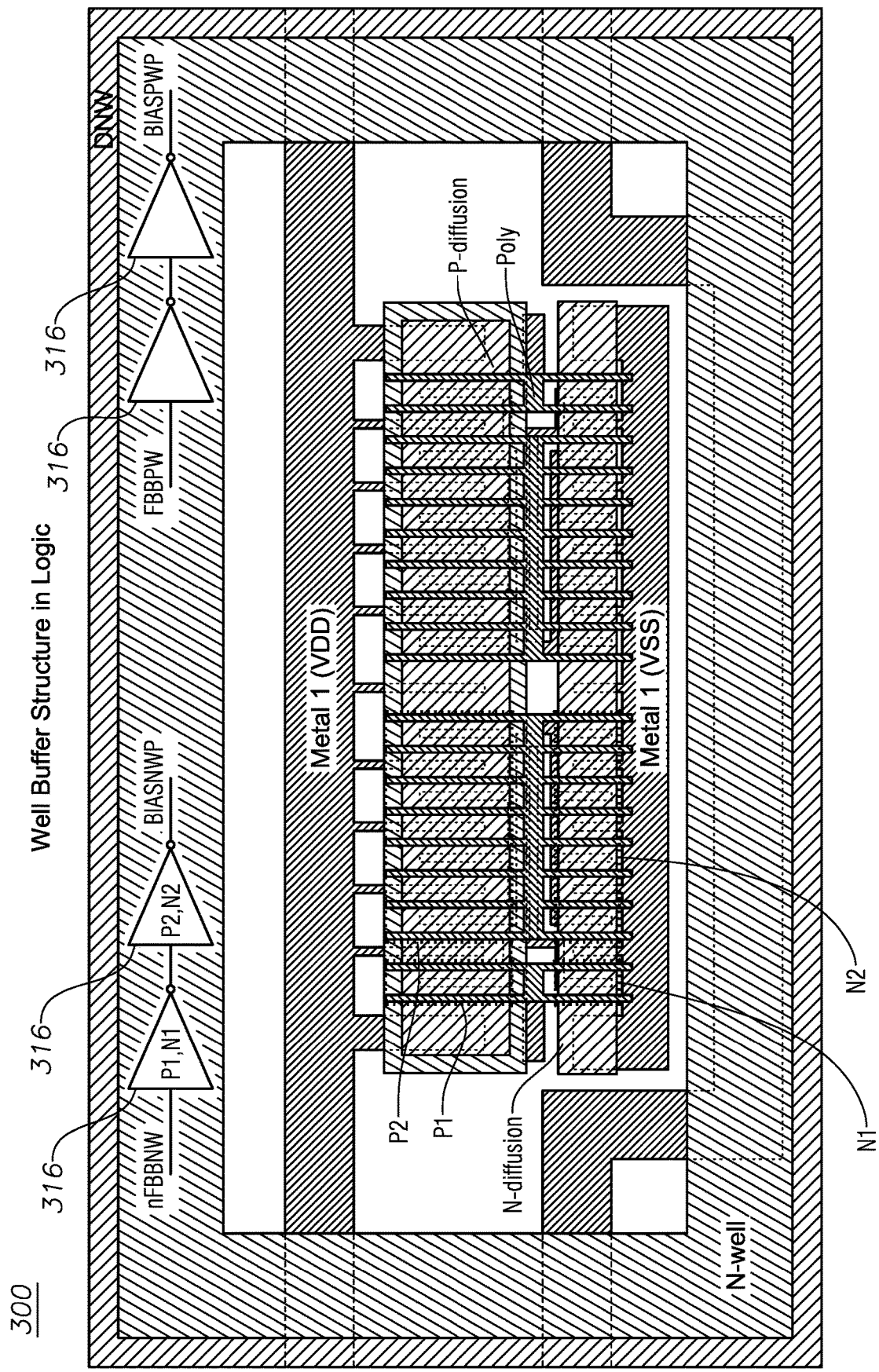
FIG. 3 illustrates a diagram of a well buffer structure in accordance with various implementations described herein.

FIG. 3 illustrates a diagram of a well buffer structure 300 in accordance with various implementations described herein. In some implementations, FIG. 3 illustrates a diagram of the well buffer structure 300 as applied in logic.

As shown in FIG. 3, the well buffer structure 300 may include one or more regions that integrate various components of a buffer (or driver), such as e.g., the one or more buffers 116 in the boundary region 106 of FIGS. 1A-1B. The regions of the well buffer structure 300 may include a metal 1 layer for providing VDD and VSS. The regions of the well buffer structure 300 may include a deep N-well (DNW) region and an N-well (NW) region. Further, the regions of the well buffer structure 300 may include one or more N-diffusion regions, one or more P-diffusion regions, and one or more poly regions that are arranged and/or configured to provide buffer or driver functionality. For instance, in some implementations, regions of the well buffer structure 300 may be arranged and/or configured to provide transistors 316 (e.g., P1, N1, P2, N2) that operate as the buffers (or drivers, or inverters) 116, 116A, 116B as shown in FIG. 1B and use the input signals FBBNW, nFBBPW to thereby body bias the one or more periphery logic devices 114 in the periphery region 104 as shown in FIG. 1B. Also, in this instance, regions of the well buffer structure 300 may be arranged and/or configured to provide pairs of well buffers 216 in a boundary region 206 as shown in FIG. 2, which correspond to pairs of buffers 116 in the boundary region 106 of FIG. 1B. As described herein above, the buffers 116, 216 may be referred to as well buffers or well drivers, and the boundary region 206 may be referred to as a well buffer insertion space.

At low voltage, transistor performance may degrade exponentially as the supply voltage (VDD) approaches the transistor threshold voltage. This may produce a scenario where chip frequency slows down drastically, which reduces computational complexity of problems that the chip tackles at low voltage. Further, this instance may refer to another scenario where the chip is on and active for longer, thus reducing sleep time and hurting overall energy efficiency. Therefore, schemes and techniques described herein seek to improve SRAM performance at low voltage by implementing one or more of the following operations in a process, e.g., starting from an SRAM macro with back-biasing enabled:

the process may draw an N-well ring around the periphery circuits;

the process may draw an N-well ring around each array of bitcells;

the process may add a DNW added over the memory macro;

the process may disconnect one or more or all array RWs (isolated P-wells) that tie BIASNWP signals and connect them to VSS;

the process may connect core array N-well to VDD;

for each RW in the periphery, the process may add a well tie, and if none exists, the process may connect one or more or all new RW well ties to BIASPWP; and the process may connect BIASNW, BIASPW to outputs of FBB (Full Body Bias or Forward Body Bias) buffer devices.

In some implementations, SRAM operation may be controlled by a digital FBB input. When FBB is asserted, the periphery wells are flipped to apply VDD on the P-wells and VSS on the N-wells, thereby forward body biasing the periphery. This scheme may be suitable for VDD<0.6V to avoid forward body biasing the well diode. FBB may refer to a static input which may need one or more or many cycles of setup time to perform RAM read and write operations. For purpose of illustration, an implementation of a layout of an FBB buffer device is shown FIG. 3.

Figure 4:
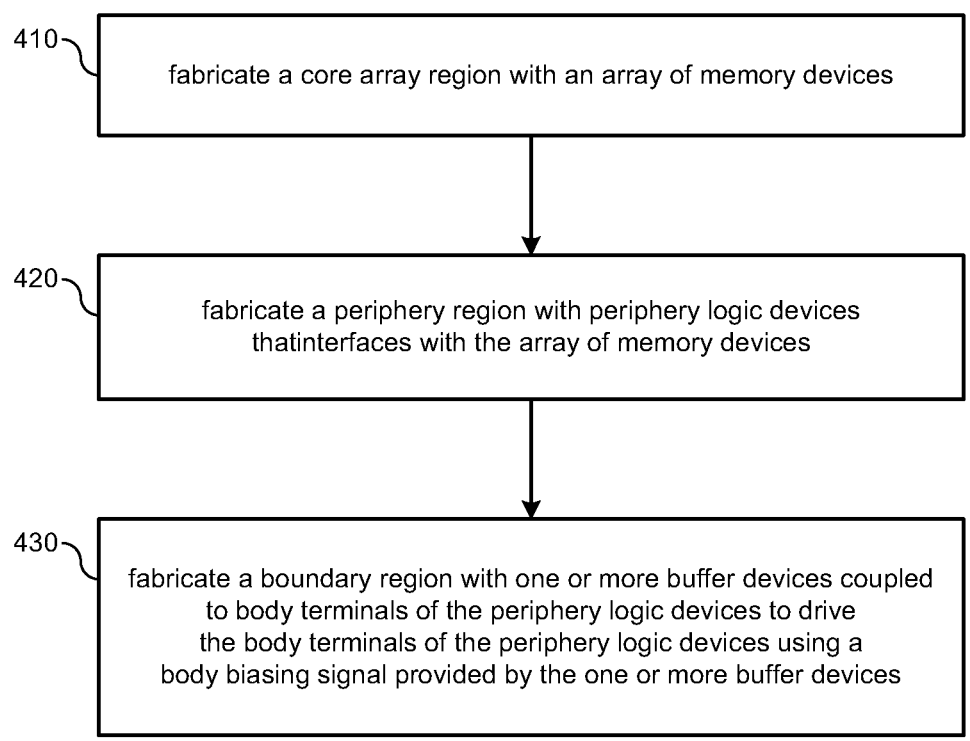
FIG. 4 illustrates a process flow diagram of a method for manufacturing an integrated circuit in accordance with various implementations described herein.

FIG. 4 illustrates a process flow diagram of a method 400 for manufacturing an integrated circuit in accordance with various implementations described herein. In some implementations, method 400 may be used for designing an integrated circuit.

It should be understood that even though method 400 may indicate a particular order of operation execution, various certain portions of operations may be executed in a different order, and on different systems. Also, additional operations and/or steps may be added to and/or omitted from method 400. Method 400 may be implemented in hardware and/or software. Further, if implemented in hardware, method 400 may be implemented with various circuit components, such as described herein in reference to FIGS. 1A-3. If implemented in software, method 400 may be implemented as a program or software instruction process that is configured for implementing periphery body biasing for various memory applications in a manner as described herein. Also, if implemented in software, instructions related to implementing method 400 may be stored in non-transitory memory and/or a database. For instance, a computer or various other types of computing devices having a processor and memory may be configured to perform method 400.

As described and shown in reference to FIG. 4, method 400 may be used for manufacturing an integrated circuit (IC) that implements periphery body biasing in various types of memory applications, such as, e.g., RAM and/or ROM applications.

At block 410, method 400 may fabricate a core array region with an array of memory devices. The core array region may refer to memory circuitry, and the array of memory devices may refer to an array of bitcells. In some implementations, each memory device in the core array region may be implemented with SRAM circuitry. As such, each memory device may include a multi-transistor SRAM cell, such as, e.g., 6T CMOS SRAM and/or other types of CMOS SRAM cells having, e.g., 4T, 8T, 10T or more transistors per bit. Thus, the memory devices may include SRAM cells, and the core array region may include an SRAM cell array. However, various other types of memory may be used.

At block 420, method 400 may fabricate a periphery region with periphery logic devices that interface with the array of memory devices. The one or more periphery logic devices may refer to one or more buffers, drivers, and/or inverters having digital inputs (or logic inputs) that are activated based on logic 0 or logic 1.

At block 430, method 400 may fabricate a boundary region with one or more buffer devices coupled to body terminals of the periphery logic devices to drive the body terminals of the periphery logic devices using a body biasing signal provided by the one or more buffer devices. The one or more buffer devices may refer to one or more inverters with digital inputs (or logic inputs) that are activated based on logic 0 or logic 1. The body biasing signal may be referred to as a forward body biasing signal provided by the one or more buffer devices. The body biasing signal may be referred to as a digital body biasing signal provided by the one or more buffer devices.

In some instances, the one or more buffer devices in the boundary region may drive the body terminal of each periphery logic device in the periphery region without affecting the body terminals of the memory devices in the core array region. In various instances, affecting the body terminals of the memory devices in the core array region may refer to affecting the body potential (or body voltage) that may be applied to the body terminals of the memory devices in the core array region.

In some implementations, the core array region, the periphery region, and the boundary region operate at low voltage. The low voltage may be applied as an operating voltage to each memory device in the core array region and each periphery logic device in the periphery region. The low voltage may be less than a diode forward voltage (of less than 0.7V at ambient temperature) depending on fabrication process technology.

Described herein are various implementations of an integrated circuit. The integrated circuit may include a core array region having an array of memory devices. The integrated circuit may include a periphery region having periphery logic devices that interface with the array of memory devices. The integrated circuit may include a boundary region having one or more buffer devices coupled to body terminals of the periphery logic devices to drive the body terminals of the periphery logic devices using a body biasing signal provided by the one or more buffer devices.

Described herein are various implementations of a memory circuit. The memory circuit may include a core array having an array of bitcells. The memory circuit may include a periphery having first logic that interfaces with the array of bitcells. The memory circuit may include a boundary having second logic coupled to body terminals of the first logic to drive the body terminals of the first logic with a body biasing signal provided by the second logic.

Described herein are various implementations of a method for manufacturing or fabricating or designing an integrated circuit. The method may include fabricating a core array region with an array of memory devices. The method may include fabricating a periphery region with periphery logic devices that interface with the array of memory devices. The method may include fabricating a boundary region with one or more buffer devices coupled to body terminals of the periphery logic devices to drive the body terminals of the periphery logic devices using a body biasing signal provided by the one or more buffer devices.

The above referenced summary section is provided to introduce a selection of concepts in a simplified form that are further described above in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a core array region having an array of memory devices;
a periphery region having periphery logic devices that interface with the array of memory devices; and
a boundary region having one or more buffer devices coupled to body terminals of the periphery logic devices to drive the body terminals of the periphery logic devices using a body biasing signal provided by the one or more buffer devices from the boundary region to the periphery region,
wherein the periphery region is disposed between the core array region and the boundary region.

2. The integrated circuit of claim 1, wherein the core array region comprises memory circuitry, and wherein the array of memory devices comprises an array of bitcell devices.

3. The integrated circuit of claim 1, wherein the one or more buffer devices comprise one or more inverters with digital inputs.

4. The integrated circuit of claim 1, wherein the core array region, the periphery region, and the boundary region operate at low voltage.

5. The integrated circuit of claim 4, wherein the low voltage is applied as an operating voltage to each memory device in the core array region and each periphery logic device in the periphery region.

6. The integrated circuit of claim 5, wherein the low voltage is less than a diode forward voltage depending on fabrication process technology.

7. The integrated circuit of claim 1, wherein the body biasing signal comprises a forward body biasing signal provided by the one or more buffer devices.

8. The integrated circuit of claim 1, wherein the body biasing signal comprises a digital body biasing signal provided by the one or more buffer devices.

9. The integrated circuit of claim 1, wherein the one or more buffer devices in the boundary region drive the body terminal of each periphery logic device in the periphery region without affecting the body terminals of the memory devices in the core array region.

10. The integrated circuit of claim 9, wherein affecting the body terminals of the memory devices in the core array region refers to affecting a body potential applied to the body terminals of the memory devices in the core array region.

11. A memory circuit, comprising:
a core array having an array of bitcells;
a periphery having first logic that interfaces with the array of bitcells; and
a boundary having second logic coupled to body terminals of the first logic to drive the body terminals of the first logic with a body biasing signal provided by the second logic from the boundary to the periphery,
wherein the periphery is disposed between the core array and the boundary.

12. The memory circuit of claim 11, wherein the memory circuit comprises a random access memory (RAM) circuit.

13. The memory circuit of claim 11, wherein the second logic receive digital inputs and are activated based on a logic zero (0) or a logic one (1).

14. The memory circuit of claim 11, wherein the periphery and the boundary operate at low voltage.

15. The memory circuit of claim 14, wherein the low voltage is applied as an operating voltage to each bitcell in the core array and each first logic in the periphery.

16. The memory circuit of claim 15, wherein the low voltage is less than a diode forward voltage depending on fabrication process technology.

17. The memory circuit of claim 11, wherein the body biasing signal comprises a digital forward body biasing signal provided by the second logic in the boundary.

18. The memory circuit of claim 11, wherein the second logic in the boundary drive the body terminal of each first logic in the periphery without affecting the body terminals of the bitcells in the core array.

19. The memory circuit of claim 18, wherein affecting the body terminals of the bitcells in the core array refers to affecting a body potential applied to the body terminals of the bitcells in the core array.

20. A method of manufacturing an integrated circuit, comprising:
fabricating a core array region with an array of memory devices;
fabricating a periphery region with periphery logic devices that interface with the array of memory devices; and
fabricating a boundary region with one or more buffer devices coupled to body terminals of the periphery logic devices to drive the body terminals of the periphery logic devices using a body biasing signal provided by the one or more buffer devices from the boundary region to the periphery region,
wherein the periphery region is disposed between the core array region and the boundary region.

* * * * *